(12) United States Patent  
Kawachi et al.

(10) Patent No.: US 8,207,664 B2  
(45) Date of Patent: Jun. 26, 2012

(54) ORGANIC ELECTROLUMINESCENCE MODULE HAVING A BENT STRIP CONDUCTOR

(75) Inventors: Hideharu Kawachi, Osaka (JP); Hirofumi Konishi, Osaka (JP); Osamu Tanahashi, Osaka (JP); Satoshi Fukano, Osaka (JP); Masanao Okawa, Osaka (JP)

(73) Assignee: Panasonic Corporation, Osaka (JP)

( * ) Notice: Subject to any disclaimer, the term of this patent is extended or adjusted under 35 U.S.C. 154(b) by 90 days.

(21) Appl. No.: 12/702,028

(22) Filed: Feb. 8, 2010

(65) Prior Publication Data

US 2010/0213833 A1 Aug. 26, 2010

(30) Foreign Application Priority Data

Feb. 20, 2009 (JP) .................................. 2009-038008

(51) Int. Cl.  
 *H01J 1/62* (2006.01)  
 *H01J 63/04* (2006.01)

(52) U.S. Cl. ........ 313/504; 313/483; 313/500; 313/501; 313/502; 313/503; 313/505; 313/506

(58) Field of Classification Search ................... None  
See application file for complete search history.

(56) References Cited

FOREIGN PATENT DOCUMENTS

JP 2007-299740 11/2007

OTHER PUBLICATIONS

English machine translation of JP 2007-299740 (Inoue et al).*

* cited by examiner

*Primary Examiner* — Natalie Walford  
(74) *Attorney, Agent, or Firm* — J.C. Patents

(57) ABSTRACT

An organic electroluminescence (EL) module capable of reducing a processing loss of wiring boards for supplying power to an anode and a cathode is provided. Each wiring board (5) is formed by bending a strip conductor in a manner that parts of the strip in the same surface contacting each other, and is arranged on the outer periphery of the element substrate (2) in a manner of connecting the extended anode (31P) with the same pole and connecting the extended cathode (31M) with the same pole. In this manner, the wiring boards (5) having a width satisfying a shape of the electrodes without cutting a conductive plate into a U shape.

3 Claims, 6 Drawing Sheets

ORGANIC ELECTROLUMINESCENCE MODULE HAVING A BENT STRIP CONDUCTOR

CROSS-REFERENCE TO RELATED APPLICATION

This application claims the priority benefit of Japan application serial no. 2009-038008, filed Feb. 20, 2009. The entirety of the above-mentioned patent application is hereby incorporated by reference herein and made a part of specification.

BACKGROUND OF THE INVENTION

1. Field of the Invention

The present invention generally relates to an organic electroluminescence (EL) module, capable of emitting light through organic EL.

2. Description of Related Art

Conventionally, an organic EL module (for example, referring to Japanese Laid-Open Patent Publication No. 2007-299740), which is capable of obtaining a surface light source by enabling an organic substance to emit light, is known. FIG. 11 shows the organic EL module. The organic EL module 100 includes a quadrangular element substrate 102 formed by glass, an organic EL element 103 formed by laminating anodes 131P, an organic layer, and cathodes 131M in sequence, a sealing portion 104 formed by silicone and for sealing the organic EL element 103, and wiring boards 105P and 105M for respectively supplying power to the anodes 131P and the cathodes 131M. An area of the organic EL element 103 is smaller than that of the element substrate 102, and the organic EL element 103 is formed near a center of the element substrate 102. In order to obtain a light emitting surface as uniform as possible, the organic EL element 103 supplies the power to the anodes 131P and the cathodes 131M from a plurality of surrounding directions. Therefore, a part of the anodes 131P and a part of the cathodes 131M extend from the sealing portion 104 to the outside differently, and are formed on the element substrate 102 along a plurality of outer peripheral edges of the element substrate 102. The wiring boards 105P and 105M, for example, are in a U shape having corners, are arranged on an outer periphery of the element substrate 102, and are respectively connected to the plurality of anodes 131P and cathodes 131M. The wiring boards 105P and 105M are connected to a direct current (DC) power source outside the organic EL module 100, and supply the power to the anodes 131P and the cathodes 131M.

In this manner, in order to connect the anodes 131P and connect the cathodes 131M differently formed along the plurality of outer peripheral edges of the element substrate 102 to supply the power, the wiring boards 105P and 105M for supplying the power are in a U shape having corners, an L shape, or a frame shape, and are arranged in a manner of surrounding the organic EL element 103. The wiring boards 105P and 105M form the U shape having the corners or the like by cutting a rectangular conductive plate serving as a base material. Therefore, the part of the base material surrounded by the U shape having the corners becomes useless, a processing loss of the wiring boards 105P and 104M is relatively high, and a manufacturing cost becomes high.

SUMMARY OF THE INVENTION

The present invention is used to solve the problems, such that in an organic EL module, a processing loss of wiring boards for supplying power to an anode and a cathode is reduced, so as to lower a manufacturing cost.

As embodied and broadly described herein, one aspect of the present invention is to provide an organic EL module, which includes a polygonal element substrate, having a light transmissive property; an organic EL element, including electrodes and an organic layer, in which the electrodes are formed by an anode and a cathode laminated on the element substrate; a sealing portion, arranged opposite to the element substrate, for sealing the organic EL element; and at least one pair of wiring boards, for supplying power to the anode and the cathode of the organic EL element. In the organic EL module, the organic EL element and the sealing portion are formed in a region inside an outer periphery of the element substrate, and parts of the anode and parts of the cathode extend to outside of an outer periphery of the sealing portion differently, and are formed on the element substrate along a plurality of outer peripheral edges of the element substrate. Each wiring board is formed by bending a strip conductor in a manner that parts of the strip in the same surface contacting each other, and is arranged on the outer periphery of the element substrate in a manner of connecting the anode in the extended parts with a same pole and connecting the cathode in the extended parts with a same pole.

In the organic EL module, the wiring boards are lead frames, and parts of the wiring boards contacting with the electrodes are in a wave shape.

In the organic EL module, the wiring board is a flexible wiring substrate comprising a flexible substrate and flat conductors disposed on two sides of the flexible substrate.

Effect of the Invention

According to the present invention, the wiring boards are formed by the bent strip conductor, such that the wiring boards having a width satisfying a shape of the electrodes without cutting a conductive plate into a U shape, and the processing loss is reduced, thereby lowering the manufacturing cost.

According to the present invention, the wiring boards contact the electrodes through a plurality of contacting portions, such that the wiring boards surely contact the electrodes even if the electrodes have high resistance, so as to uniformly supply the power to the electrodes, thereby obtaining a uniform light emitting surface.

According to the present invention, the wiring board is a flexible wiring substrate, and is bent to press and contact the electrodes, such that when the flexible wiring substrate is used to press and contact a plurality of electrodes, it is easier to absorb the size deviation of the flexible substrate, contact position deviation, and electrode position deviation.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
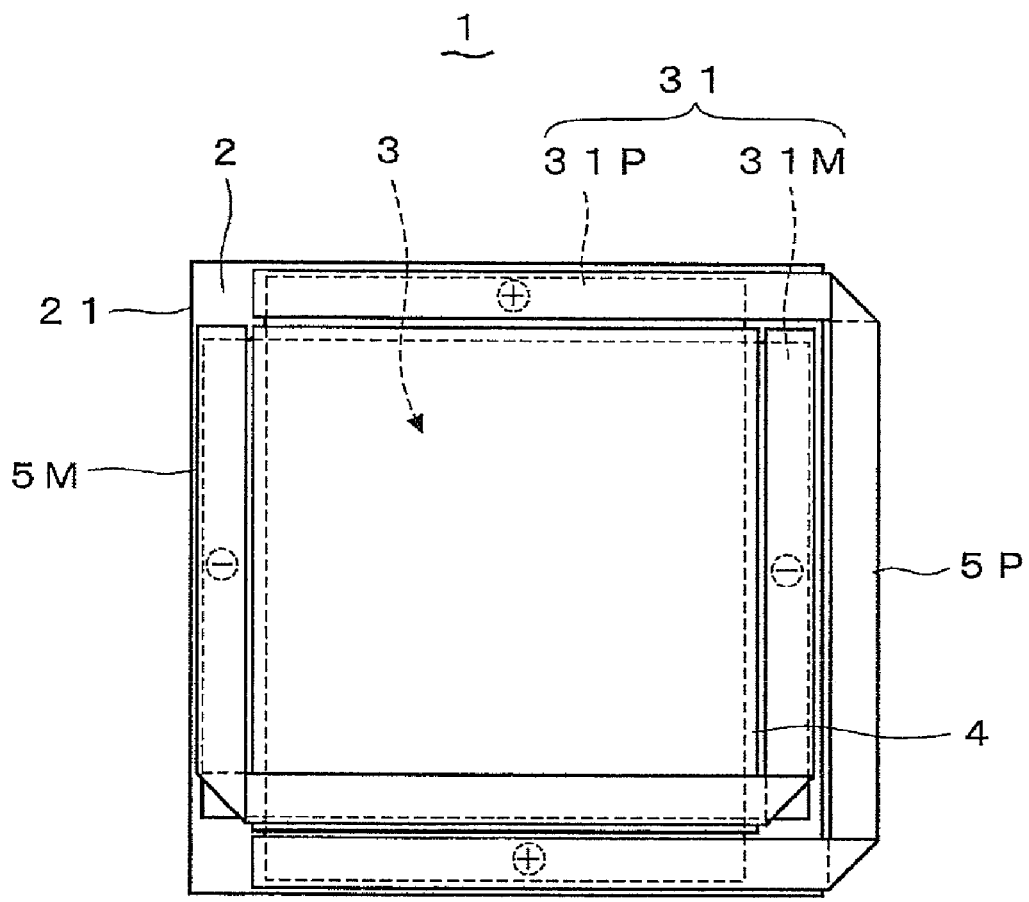
FIG. 1 is a plan view of an organic EL module according to a first embodiment of the present invention.

Reference will now be made in detail to the present embodiments of the invention, examples of which are illustrated in the accompanying drawings. Wherever possible, the same reference numbers are used in the drawings and the description to refer to the same or like parts.

First Embodiment

Figure 2:
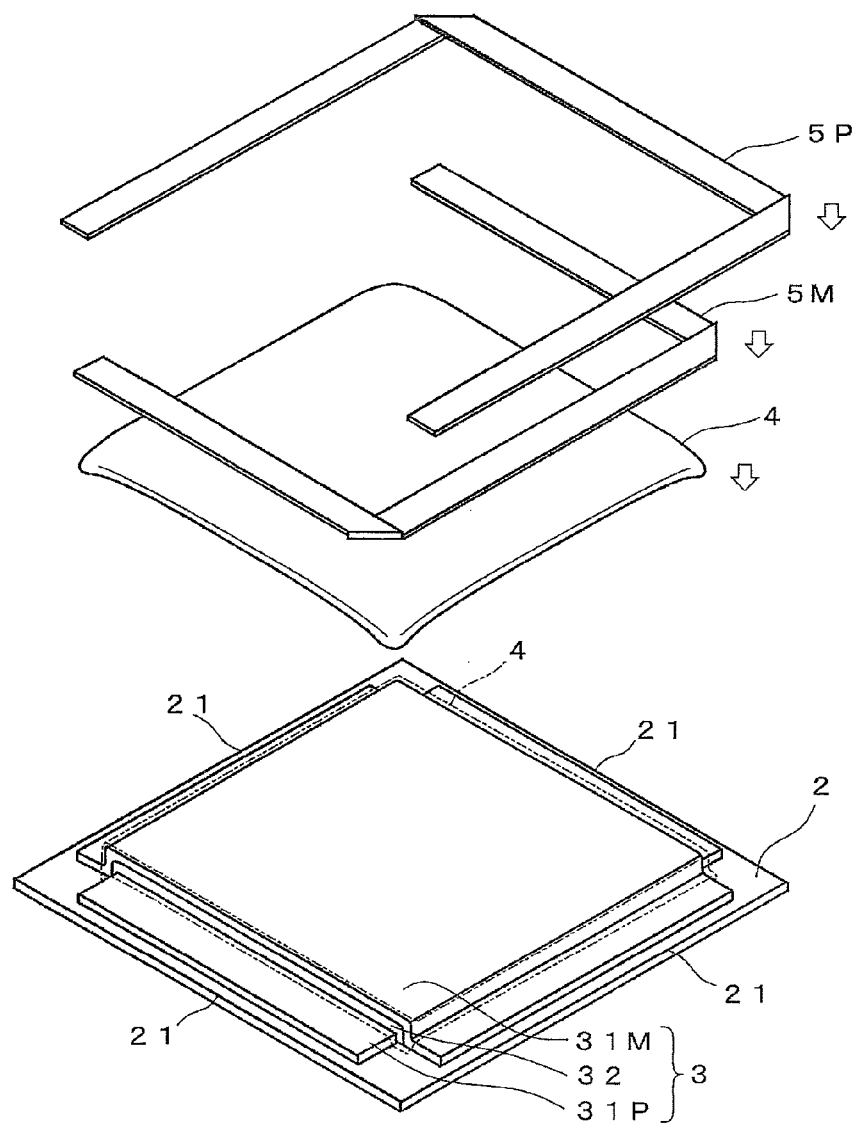
FIG. 2 is a three-dimensional exploded view of the organic EL module.

Referring to FIGS. 1 to 6A and 6B, an organic EL module according to a first embodiment of the present invention is described. As shown in FIGS. 1 and 2, the organic EL module 1 includes a polygonal element substrate 2, having a light transmissive property; an organic EL element 3, including electrodes 31 and an organic layer 32, in which the electrodes 31 are formed by an anode 31P and a cathodes 31M laminated on the element substrate 2; a sealing portion 4, arranged opposite to the element substrate 2, for sealing the organic EL element 3; a wiring board 5P, for supplying power to the anode 31P; and a wiring board 5M, for supplying power to the cathodes 31M. The organic EL element 3 and the sealing portion 4 are formed in a region inside an outer periphery of the element substrate 2. Parts of the anode 31P and parts of the cathode 31M extend to outside of an outer periphery of the sealing portion 4 differently, and are formed on the element substrate 2 along a plurality of outer peripheral edges 21 of the element substrate 2. Each wiring board 5P and 5M is formed by bending a strip conductor in a manner that parts of the strip in the same surface contacting each other. The wiring board 5P is arranged on the outer periphery of the element substrate 2 in a manner of connecting the extended anode 31P, and the wiring board 5M is arranged on the outer periphery of the element substrate 2 in a manner of connecting the extended cathode 31M. The wiring boards 5P and 5M are respectively connected to a positive pole and a negative pole of a DC power source disposed outside the organic EL module 1 through a pair of conducting wires. The wiring boards 5P and 5M have the same potential, such that the conducting wires are installed at appropriate positions of the wiring boards 5P and 5M.

Figure 3:
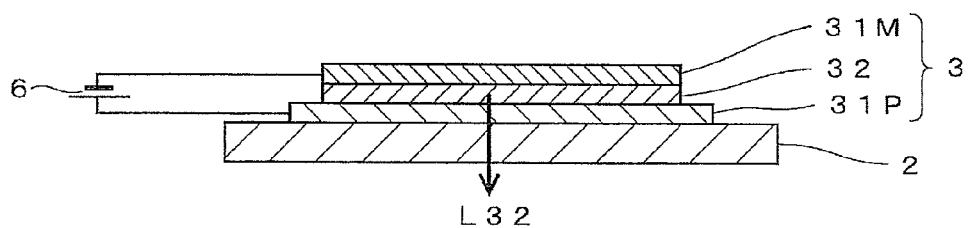
FIG. 3 is a cross-sectional view of an organic EL element in the organic EL module.

As shown in FIG. 3, the organic EL element 3 is a surface light emitting source, and is formed on the element substrate 2 formed by flat glass or acryl resin etc. Layers of the organic EL element 3 include the anode 31P serving as the transparent electrode, the organic layer 32, and the cathode 31M, which are laminated in sequence through a vacuum evaporation method or an ink jetting method. The material of each layer is as follows: for example, the anode 31P is made of indium tin oxide (ITO), the organic layer 32 is made of $Alq_3$, and the cathode 31M is made of aluminum or other metals. The wiring boards supply the power to the anode 31P and the cathode 31M from the DC power source 6, such that light is emitted from the organic layer 32. As shown by an arrow L32, the light emitted from the organic layer 32 exits to the outside after passing through the transparent anode 31P and the element substrate 2. The cathode 31 formed by the metal reflects the light incident from the organic layer 32 to the element substrate 2. In addition to the light emitting layer formed by $Alq_3$, other layers may be further laminated on the organic layer 32, for example, a hole transport layer formed by arylamine may be laminated on the anode 31P side of the light emitting layer, or an electron injection layer formed by lithium complex is laminated on the cathode 31M side.

Figure 4A:
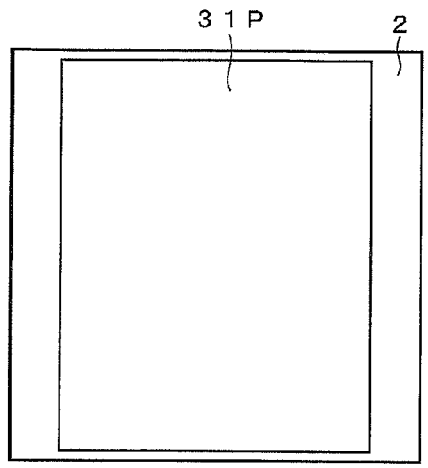
FIGS. 4A to 4E are plan views showing the sequence of forming the organic EL module.

Referring to FIGS. 4A to 4E, the sequence of forming the organic EL module 1 is described. As shown in FIG. 4A, firstly, the anode 31P is laminated on the element substrate 2.

Figure 4B:
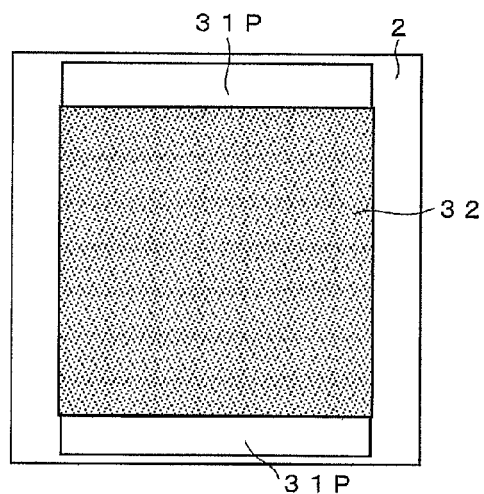

Next, as shown in FIG. 4B, the organic layer 32 (dot pattern portion) is laminated on the anode 31P. The organic layer 32 is formed adjacent to a central portion of the element substrate 2, that is, the organic layer 32 is formed in the region inside the outer periphery of the element substrate 2.

Figure 4C:
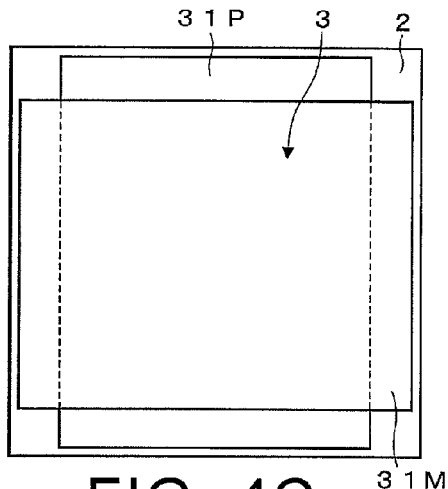

Then, as shown in FIG. 4C, the cathode 31M is laminated. In the region inside the outer periphery of the element substrate 2, the organic layer 32 is sandwiched between the anode 31P and the cathode 31M, so as to form the organic EL element 3.

Figure 4D:
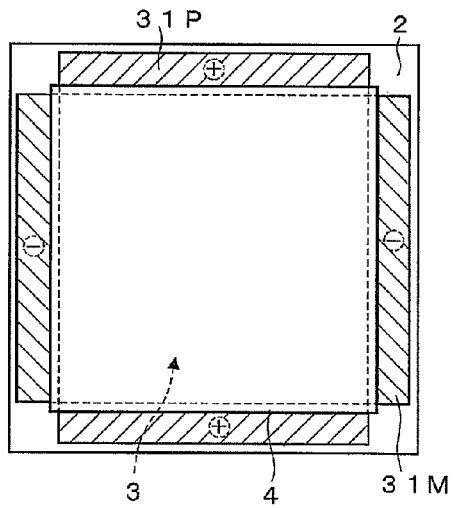

Afterwards, as shown in FIG. 4D, the sealing portion 4 is formed by coating silicone, epoxy, or other sealing resins. The sealing portion 4 wraps the organic EL element 3, so as to protect the organic EL element 3 from being affected by moisture or oxygen in the air. Parts of the anode 31P extend to the outside of the outer periphery of the sealing portion 4 (a vertical direction in the drawing), a group of opposite edges of the anode 31P are located on the outside of the outer periphery of the sealing portion 4, and other opposite edges are located on a region inside the outer periphery of the sealing portion 4. Parts of the cathode 31M extend to the outside of the outer periphery of the sealing portion 4 (a horizontal direction in the drawing) in a direction approximately orthogonal to an extending direction of the anode 31P. In order to externally and electrically connect to the organic EL element 3, the extended parts of the anode 31P and the cathode 31M (dashed line portions) are exposed out of the sealing portion 4. Further, in order to obtain a uniform light emitting surface, the electrodes with the same pole are arranged on the opposite edges of the element substrate 2.

Figure 4E:
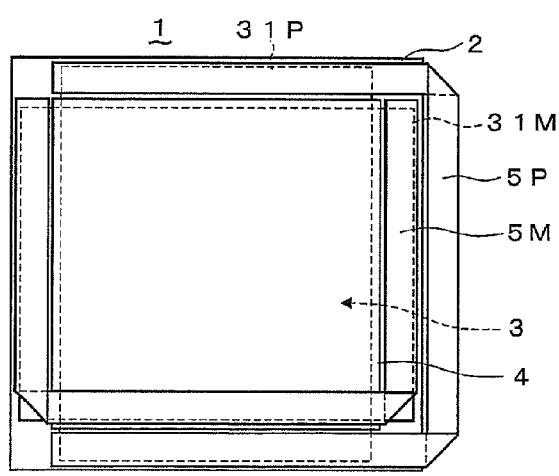

Then, as shown in FIG. 4E, the wiring boards 5P and 5M in a U shape having corners are arranged in a manner of not overlapping with each other on the outer periphery of the element substrate 2. The wiring board 5P of a positive side contacts two extended parts of the anode 31P, and the wiring board 5M on a negative side contacts the two extended parts of the cathode 31M. In addition, the wiring boards 5P and 5M need not to be entirely located on the outer periphery of the element substrate 2, that is, a part may be disposed on the sealing portion 4, or extends out of the element substrate 2.

Figure 5:
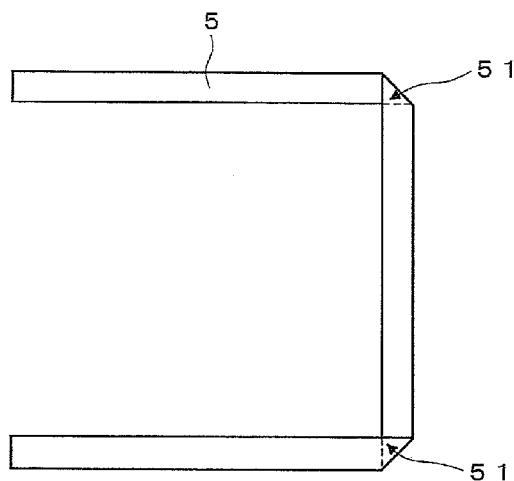
FIG. 5 is a plan view of a wiring board in the organic EL module.
Figures 6A, 6B:
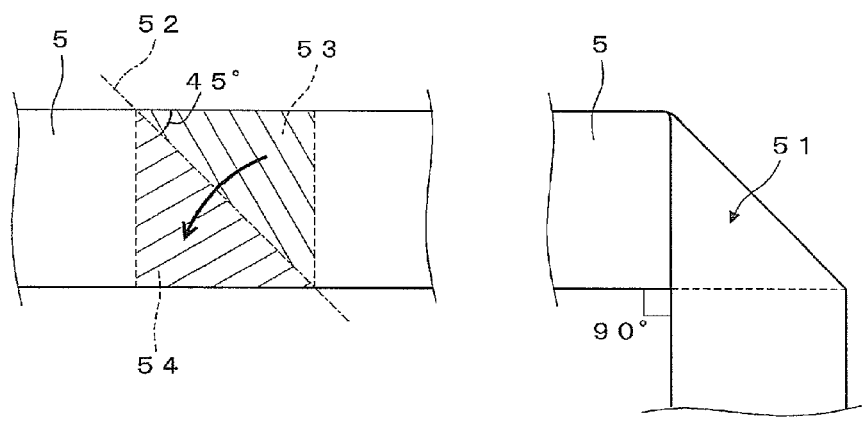
FIG. 6A is a partial enlarged view of the wiring board before being bent.
FIG. 6B is a partial enlarged view of the wiring board after being bent.

Referring to FIGS. 5, 6A and 6B, the sequence of forming the wiring boards 5P and 5M (hereinafter referred to as the wiring board 5) is described. As shown in FIG. 5, the wiring board 5 is formed by approximately perpendicularly bending a strip conductor formed by a lead frame at bending portions 51, such that the wiring board 5 forms, for example, the U shape having corners. Further, under the installed state, the wiring board 5 is in a shape enabling the electrodes with the same pole among the plurality of electrodes 31, which are oppositely exposed on the element substrate 2, connected to each other.

As shown in FIG. 6A, the wiring board 5 is valley-folded at a score 52 approximately at an angle of 45° with a longitudinal direction, and is bent in a manner of contacting surfaces 53 and 54 adjacent to two sides of the score 52, so as to form the bending portion 51 bent perpendicularly, as shown in FIG. 6B.

In the organic EL module 1 formed in this manner, the wiring board 5 is formed by the bent strip conductor, such that the wiring board 5 may realize a shape having a width satisfying a shape of the electrodes 31 without cutting a conductive plate into a U shape, and the processing loss is reduced, thereby lowering the manufacturing cost.

Variation of First Embodiment

Figure 7:
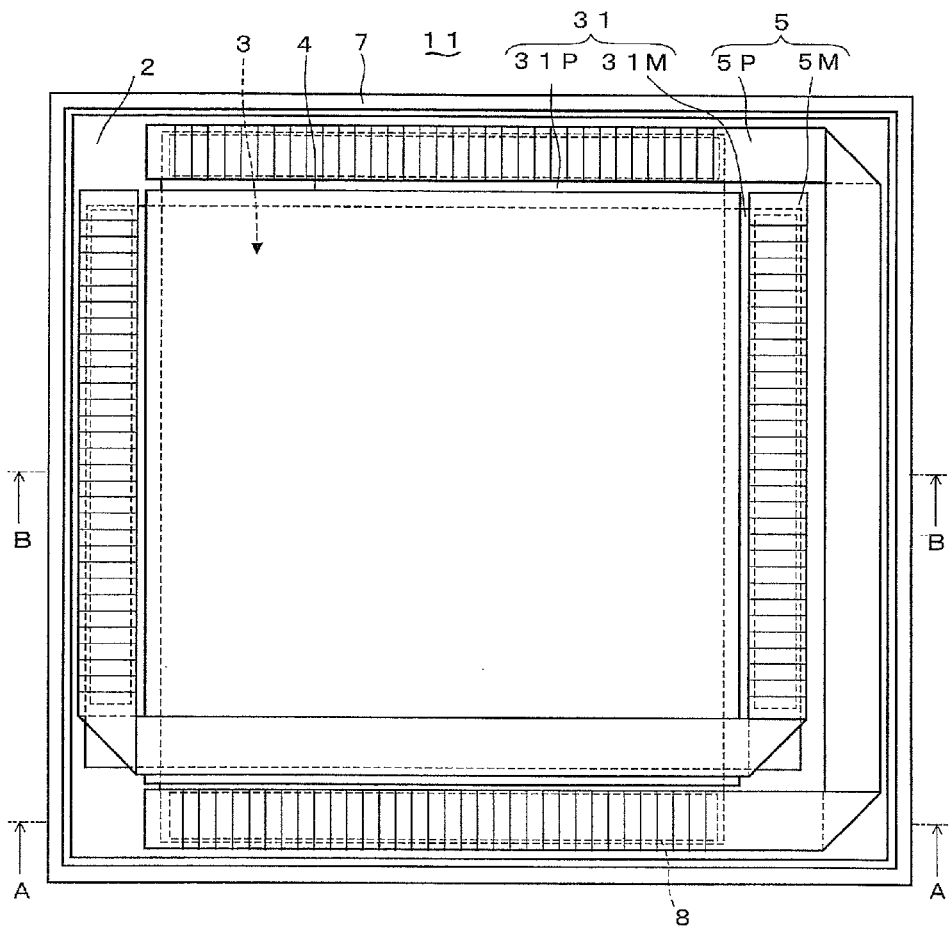
FIG. 7 is a plan perspective view of an organic EL module according to a variation of this embodiment.
Figure 8:
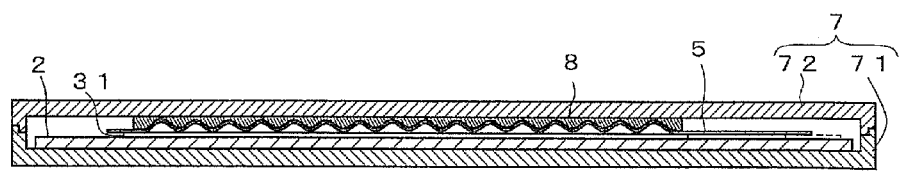
FIG. 8 is an end view drawing along line A-A of FIG. 7.
Figure 9:
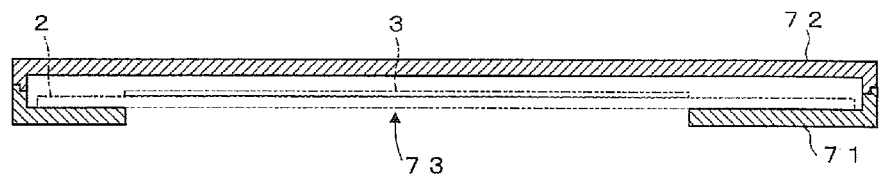
FIG. 9 is an end view drawing of a case of the organic EL module along line B-B of FIG. 7.

Next, referring to FIGS. 7 to 9, an organic EL module according to the variation of the first embodiment is described. As shown in FIGS. 7 and 8, the organic EL module 11 of this variation is accommodated in a case 7. In this variation, wiring boards 5 are lead frames, and parts of the wiring boards 5 contacting electrodes 31 are in a wave shape. The wiring boards 5 include a wiring board 5P of a positive side and a wiring board 5M of a negative side disposed in pair, and parts of the wiring board 5P and the wiring board 5M contacting the anode 31P and the cathode 31M respectively form the wave shape. Alternatively, only the wiring board 5P of the positive side in the wiring boards 5 is in the wave shape, and the wiring board 5M of the negative side is in a flat shape.

The case 7 is made by resin processed into a case shape, and is formed by a front case 71 and a back case 72. In the case 7, an element substrate 2 emitting the light serves as the front case 71 to accommodate the organic EL module 11, and the front case 71 and the back case 72 are engaged. A thermally conductive elastomer 8 formed by silicone rubber or the like is disposed between the parts of the wiring boards 5 forming the wave shape and the back case 72. The thermally conductive elastomer 8 presses the wiring board 5 on the electrodes 31 to form an electrical connection. The wiring boards 5 are connected to a DC power source outside the case 7 through conducting wires penetrating the back case 72. The organic EL element 3 supplies power to the electrodes 31 through the wiring boards 5, so as to emit the light. Heat generated by the organic EL element 3 is delivered to the back case 72 through the thermally conductive elastomer 8, and is released to the atmosphere from the back case 72.

As shown in FIG. 9, an opening portion 73 is disposed on a part of the front case 71 opposite to the organic EL element 3. The light emitted from the organic EL element 3 is irradiated through the opening portion 73.

In the organic EL module 11 according to the variation of the present invention, the wiring boards 5 contact the electrodes 31 through a plurality of contacting portions, such that the wiring boards 5 surely contact the electrodes 31 even if the electrodes 31 have relatively high resistance, so as to uniformly supply the power to the electrodes 31, thereby obtaining a uniform light emitting surface.

Second Embodiment

Figure 10:
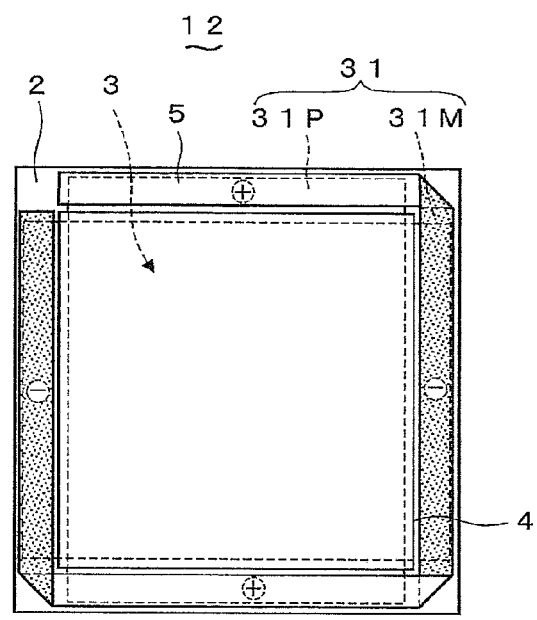
FIG. 10 is a plan view of an organic EL module according to a second embodiment of the present invention.
Figure 11:
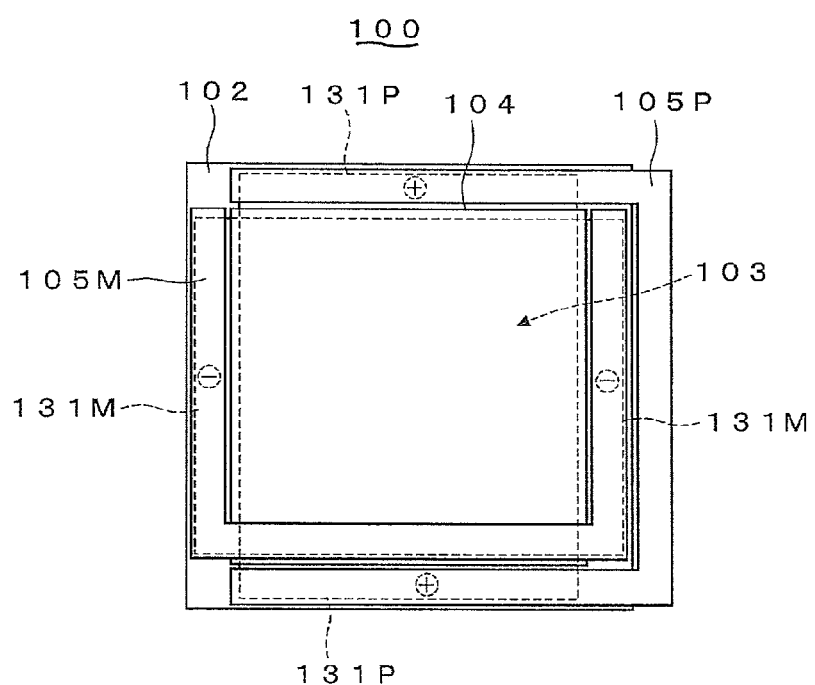
FIG. 11 is a plan view of a conventional organic EL module.

Referring to FIG. 10, an organic EL module according to a second embodiment of the present invention is described. In the organic EL module 12 of this embodiment, the wiring board 5 is a flexible wiring substrate having flat conductors on two sides of a flexible substrate, so as to replace the single-plate conductor of the first embodiment. The flexible wiring substrate includes an insulating substrate serving as a base plate; conductors on two sides of the substrate, and cover layers (surface protective films) on surfaces of the conductors. The wiring board 5 is formed by bending the flexible wiring substrate in a strip shape in a manner that parts of the strip on the same surface contacting each other, so as to form a frame shape of surrounding the organic EL element 3. Parts of the conductors of the wiring board 5 contacting electrodes 31 are exposed from the cover layers, such that the conductor on one side is connected to an anode 31P, and then the flexible wiring substrate is overturned after being bent, such that the conductor on the other side is connected to a cathode 31M. The conductors of the wiring board 5 press and contact the electrodes 31 through an anisotropic conducting film (ACF).

In this manner, in the organic EL module 12 of this embodiment, the wiring board 5 being the flexible wiring substrate is bent to press and contact the electrodes 31, such that when a flexible wiring substrate is used to press and contact a plurality of electrodes 31, it is easier to absorb the size deviation of the flexible substrate, contact position deviation, and electrode position deviation.

In addition, the present invention is not limited to the structure of the embodiments, and variations may be made without departing from the spirit of the present invention. For example, the wiring boards may be bent to form an L shape, and a pair of L-shaped wiring boards is arranged on the element substrate in a manner that the bending portions of the wiring boards are located on diagonal corners. Further, the organic EL element may also be hexagonal, and the anode and the cathode differently extend towards three directions respectively, such that the anode and the cathode are connected to the flexile wiring substrate bent to an angle of approximately 120°.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An organic electroluminescence (EL) module, comprising a polygonal element substrate, having a light transmissive property; an organic EL element, comprising electrodes and an organic layer, wherein the electrodes comprise an anode and a cathode laminated on the element substrate; a sealing portion, arranged opposite to the element substrate, for sealing the organic EL element; and at least one pair of wiring boards, for supplying power to the anode and the cathode of the organic EL element, wherein the organic EL element and the sealing portion are formed in a region inside an outer periphery of the element substrate, and parts of the anode and parts of the cathode extend to outside of an outer periphery of the sealing portion differently, and are formed on the element substrate along a plurality of outer peripheral edges of the element substrate, each of the wiring boards is formed by bending a strip conductor in a manner that parts of the strip conductor in a same surface contacting each other, and is arranged on the outer periphery of the element substrate in a manner of connecting the anode in the extended parts with a same pole and connecting the cathode in the extended parts with a same pole.

2. The organic EL module according to claim 1, wherein the wiring boards are lead frames, and parts of the wiring boards contacting the electrodes are in a wave shape.

3. The organic EL module according to claim 1, wherein the wiring board is a flexible wiring substrate comprising:
a flexible substrate; and
flat conductors, disposed on two sides of the flexible substrate.

* * * * *